United States Patent [19]
Chao

[11] Patent Number: 6,144,538
[45] Date of Patent: Nov. 7, 2000

[54] HIGH VOLTAGE MOS TRANSISTOR USED IN PROTECTION CIRCUITS

[75] Inventor: Mei-Lin Chao, Hsin-Chu, Taiwan

[73] Assignee: United Microelectronics Corp., Hsin-Chu, Taiwan

[21] Appl. No.: 09/469,344

[22] Filed: Dec. 20, 1999

[51] Int. Cl.[7] ................................................. H02H 9/00
[52] U.S. Cl. ........................... 361/56; 361/91.1; 361/111; 361/118
[58] Field of Search ............................... 361/56, 58, 91.1, 361/111, 118, 119, 127

[56] References Cited

U.S. PATENT DOCUMENTS 5,181,092  1/1993  Atsumi ..................................... 257/361

Primary Examiner—Stephen W. Jackson
Attorney, Agent, or Firm—Winston Hsu

[57] ABSTRACT

An electrostatic discharge (ESD) protection circuit is formed on a semiconductor wafer. The semiconductor wafer comprises a substrate, an active region having a doped area formed in a predetermined area on the surface of the substrate, and a field oxide layer made of silicon oxide formed on the surface of the substrate and surrounding the active region. The HV MOS comprises a gate made by stacking a doped polysilicon layer on a gate oxide layer. A DDD (double diffuse drain) source and a DDD drain are installed inside the doped area and positioned on opposite sides of the gate, and an insulation layer made of silicon dioxide is positioned between the gate and the source and between the gate and the drain. There is no drift region at the intersection of the doped area of the active region and the insulation layer. The input port of the protection circuit is electrically connected to the source. The drain and the gate are electrically connected to a voltage source. When an input voltage from the input port is higher than a critical voltage between the source and the drain, the source and the drain will electrically conduct together through the doped area in the active region so as to eliminate the input voltage from the input port.

10 Claims, 7 Drawing Sheets

HIGH VOLTAGE MOS TRANSISTOR USED IN PROTECTION CIRCUITS

BACKGROUND OF THE INVENTION

1. Field of the Invention

The present invention relates to a high voltage metal oxide semiconductor (HV MOS) transistor, and more particularly, to an HV MOS transistor used in electrostatic discharge protection circuits.

2. Description of the Prior Art

As the density of very large scale integrated (VLSI) circuit increases, the components of the circuits are getting smaller and smaller. When the gate oxide of the MOS transistor gets thinner and thinner, it becomes increasingly easy for the gate oxide to be destroyed by electrostatic discharge (ESD). In order to prevent an excessive current from entering an IC via an I/O pin and destroying the internal circuitry of the IC, a protection circuit is usually installed between the internal circuitry and the I/O pin. The protection circuit must activate before the pulse of an electrostatic discharge can reach the internal circuitry so as to instantly eliminate the high voltage of the pulse. Consequently, the protection circuit must use HV MOS transistors to guarantee that the protection circuit can operate correctly under high voltages and prevent the destruction caused by ESD.

Please refer to FIG. 1. FIG. 1 is a circuit diagram of a prior art ESD protection circuit 10. The prior art ESD protection circuit 10 is installed between an internal circuit 11 and a bonding pad 12. The bonding pad 12 is used to connect to an I/O pin (not shown) in the following-up packing process. The ESD protection circuit 10 comprises an input port 13, a 30 volt voltage source 14, a grounding point 15, a first N-type HV MOS transistor 16, a P-type HV MOS transistor 17, and a second N-type HV MOS transistor 18. The input port 13 is electrically connected to the internal circuit 11 and the bonding pad 12. The HV MOS transistor 16 is electrically installed between the input port 13 and the grounding point 15. The first HV MOS transistor 17 is electrically installed between input port 13 and the voltage source 14. The HV MOS transistor 18 is electrically installed between the grounding point 15 and the voltage source 14, and is electrically connected to the HV MOS transistor 17. In each HV MOS transistor the source, well (or substrate), and drain form a parasitic bipolar junction transistor (BJT). The threshold voltage of the parasitic bipolar junction transistor (BJT) is smaller than the breakdown voltage of the gate in the internal circuit 11. The parasitic bipolar junction transistor (BJT) will turn on before the electrostatic discharge pulse reaches the internal circuit 11, and so serves to protect the gate of the internal circuit 11 from excess voltage and current surges.

An input voltage from the bonding pad 12 will be delivered into the internal circuit 11 via the input port 13 of the ESD protection circuit 10. When the input voltage exceeds the threshold voltage of the BJT transistor inside the HV MOS transistors 16, 17, and 18, the HV MOS transistors 16, 17 and 18 will conduct the large current caused by the high voltage to the grounded port 15, thereby eliminating the high voltage input from the input port 13. For example, if the input voltage is negative, the P-type HV MOS transistor 17 and the second N-type HV MOS transistor 18 will turn on in turn to divert the current caused by the negative voltage to the grounded port 15, and so reduce the voltage input into the internal circuit 11. Similarly, if the input voltage is positive, the first N-type HV MOS transistor 16 will turn on to reduce the voltage via the grounded port 15.

Please refer to FIG. 2. FIG. 2 is a cross-sectional diagram of the structure of the first N-type HV MOS transistor 16 used in the ESD protection circuit 10 shown in FIG. 1. The first and second N-type HV MOS transistors 16, 18 of the prior art ESD protection circuit are formed on a semiconductor wafer 20. In the following explanation, the first N-type HV MOS transistor 16 is taken as an example to explain the structure of the HV MOS transistors 16, 18 in the prior art ESD protection circuit 10. The semiconductor wafer 20 comprises a substrate 22, an active region 24 installed in a predetermined area on the surface of the substrate 22, and a first insulation layer 26 made of field oxide (FOX) installed on the surface of the substrate 22 and surrounding the active region 24. The active region 24 comprises a P-type doped area 28 that serves as a P-well.

The prior art first N-type HV MOS transistor 16 comprises a gate 30 installed on the active region 24, a source 32 and a drain 34 installed in the doped area 28 of the active region 24 and positioned on opposite sides of the gate 30, a second insulation layer 36 made of field oxide installed on the active region 24 and positioned between the gate 30 and the source 32 and between the gate 30 and the drain 34, and a drift region 38 installed at the intersection of the doped area 28 of the active region 24 and the second insulation layer 36. The drift region 38 acts as an n-drift region. Both the source 32 and the drain 34 are double diffuse drains (DDD) 40 comprising an N-type doped area 33. The gate 30 is made by stacking a doped polysilicon layer 42 on top of a gate oxide layer 44. The second insulation layer 36 is used for insulating the gate 30 from the source 32 as well as insulating the gate 30 from the drain 34.

The structure of the P-type HV MOS transistor 17 and the structure of the first, second N-type HV MOS transistors 16, 18 are the same except that the dopants of the doped areas are different. The doped area 28 in the active region 24 of the P-type HV MOS transistor 17 is an N-well, the drift region 38 is a p-drift region, and both the double diffuse drains (DDD) 40 of the source 32 and the drain 34 comprise a p-type doped area.

Currently, HV MOS transistors comprise a doped area of n-drift or p-drift, which is used to solve the problem that the channel length of the HV MOS transistor is too long to promote conduction between the components. So, every HV MOS transistor on the substrate 22 of the semiconductor wafer 20, including HV MOS transistors 16, 17 and 18, has a drift region 38 at the intersection of the doped area 28 of the active region 24 and the second insulation layer 36. However, because the drift region 38 of the prior art HV MOS transistor is protruding from the double diffuse drains 40, the drift region 38 has a higher horizontal electrical field and causes tip effects. In other words, when a high voltage is delivered into the HV MOS transistors 16, 17 and 18, a strong horizontal electrical field can easily be generated inside the path and emit main carriers (electrons are the main carriers of the N-type HV MOS transistor, and holes are the main carriers of the P-type HV MOS transistor) directly from the source 32 via the drift region 38 into the drain 34, rather than along the path from the source 32 to the doped area 28 of the active region 24 to the drain 34. This causes short circuiting between the source 32 and the drain 34 and destroys the structure of the gate oxide layer 44, preventing the BJT transistor from turning on to discharge the high voltage.

SUMMARY OF THE INVENTION

It is therefore a primary objective of the present invention to provide an HV MOS transistor used in electrostatic discharge protection circuits which avoids short circuits between the source and drain so as to successfully turn on the BJT transistor to discharge high voltages.

In a preferred embodiment, the present invention provides a high voltage metal oxide semiconductor (HV MOS) transistor used in an electrostatic discharge (ESD) protection circuit. The ESD protection circuit is formed on a semiconductor wafer. The semiconductor wafer comprises a substrate, an active region having a doped area formed in a predetermined area on the surface of the substrate, and a field oxide layer made of silicon oxide formed on the surface of the substrate and surrounding the active region. The present invention HV MOS comprises a gate made by stacking a doped polysilicon layer on a gate oxide layer, a DDD (double diffuse drain) source and a DDD drain installed inside the doped area and positioned on opposite sides of the gate, and an insulation layer made of silicon dioxide and positioned between the gate and the source and between the gate and the drain. A drift region doesn't exist at the intersection of the doped area of the active region and the insulation layer, thus enhancing the critical voltage between the source and the drain. The input port of the protection circuit is electrically connected to the source. The drain and the gate are electrically connected to a voltage source. When an input voltage from the input port is higher than a critical voltage between the source and the drain, the source and the drain will electrically conduct together through the doped area in the active region so as to eliminate the input voltage from the input port.

It is an advantage of the present invention that the present invention HV MOS transistor does not have a drift region at the intersection of the doped area of the active region and the insulation layer. This enhances the critical voltage between the source and the drain. Furthermore, the present invention HV MOS transistor avoids the high horizontal electric fields caused by a drift region, thereby avoiding short circuiting between the source and the drain. When a high voltage is input into the present invention HV MOS transistor, the main carriers will flow along the path from the source to the doped area of the active region to the drain so as cause the BJT transistor to turn on and discharge the high voltage to protect the internal circuits.

These and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 3:
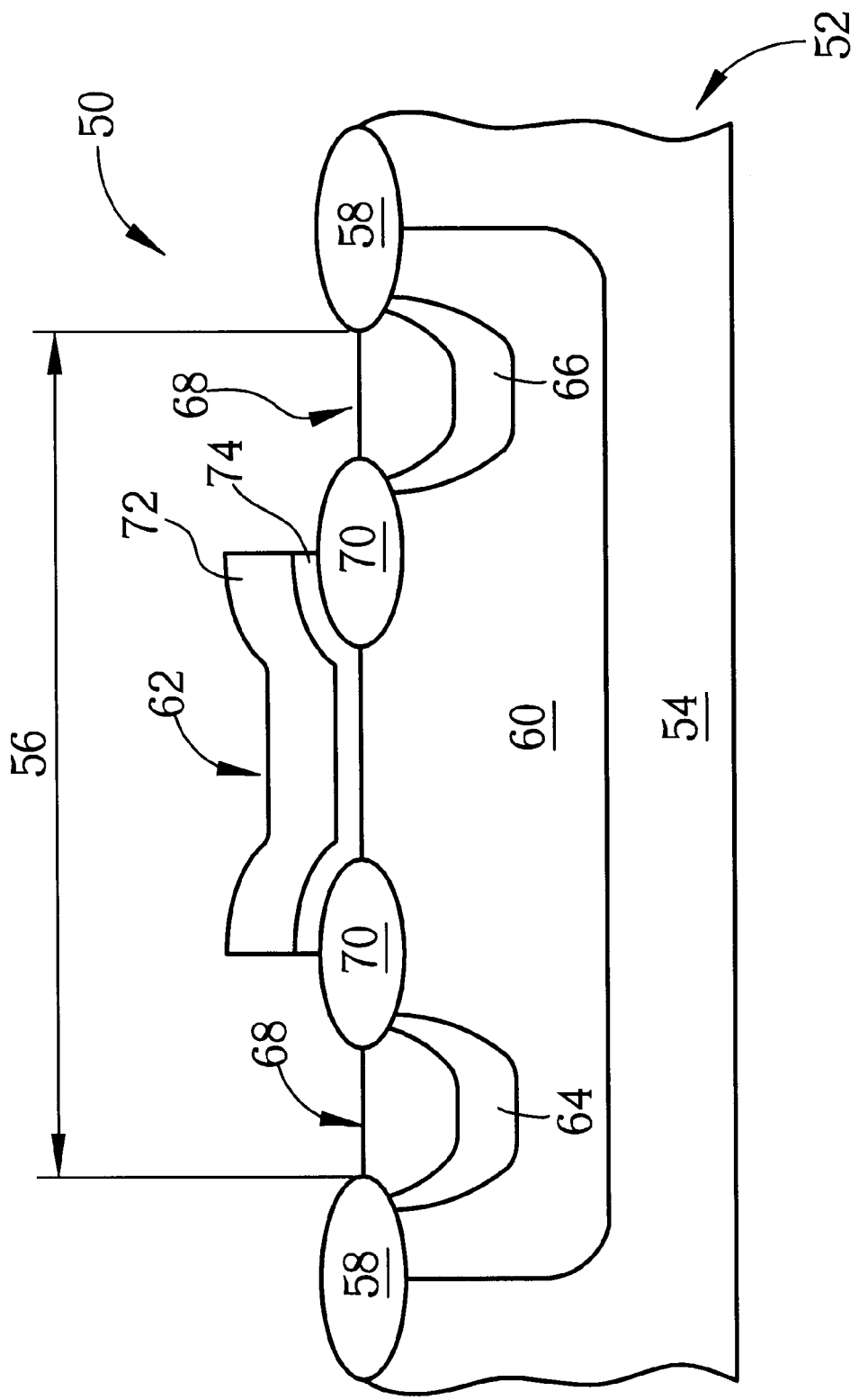
FIG. 3 is a cross-sectional diagram of the structure of the HV MOS transistor used in an ESD protection circuit according to the present invention.

Please refer to FIG. 3. FIG. 3 is a cross-sectional diagram of the structure of an HV MOS transistor 50 used in an ESD protection circuit according to the present invention. The present invention HV MOS transistor 50 can be used in the electrostatic discharge (ESD) protection circuit 10, shown in FIG. 1. The ESD protection circuit 10 is formed on a semiconductor wafer 52 and comprises an input port. The semiconductor wafer 52 comprises a substrate 54, an active region 56 formed in a predetermined area on the surface of the substrate 54, and a first insulation layer 58 of field oxide made of silicon dioxide ($SiO_2$) formed on the surface of the substrate 54 and surrounding the active region 56. The active region 56 comprises a doped area 60. When the structure of the present invention HV MOS transistor 50 is applied in the manufacture of an N-type HV MOS transistor, the doped area 60 is a P-well. However, when the structure of the present invention HV MOS transistor 50 is applied in the manufacture of a P-type HV MOS transistor, the doped area 60 is an N-well.

The present invention HV MOS transistor 50 comprises a gate 62 installed on the active region 56, a source 64 and a drain 66 installed inside the doped area 60 of the active region 56 and positioned on opposite sides of the gate 62, and a second insulation layer 70 of field oxide made of silicon dioxide installed on the active region 56 and positioned between the gate 62 and the source 64 and between the gate 62 and the drain 66. Both the source 64 and the drain 66 are double diffuse drains (DDD) 68. The second insulation layer 70 is used for insulating the gate 62 from the source 64 as well as insulating the gate 62 from the drain 66. There is no drift region at the intersection of the doped area 60 of the active region 56 and the second insulation layer 70, thus enhancing the critical voltage between the source 64 and the drain 66.

In the present invention, the structure of the P-type HV MOS transistor (not shown) used in the ESD protection circuit 10 and the structure of the N-type HV MOS transistor 50 are similar. The difference is merely that the doped area 60 in the active region 56 of the P-type HV MOS transistor is an N-well, and the double diffuse drains (DDD) 68 of the source 64 and the drain 66 comprise P-type doped areas; whereas the doped area 60 in the active region 56 of the N-type HV MOS transistor is a P-well, and the double diffuse drains 68 of the source 64 and the drain 66 comprise N-type doped areas.

Figure 4:
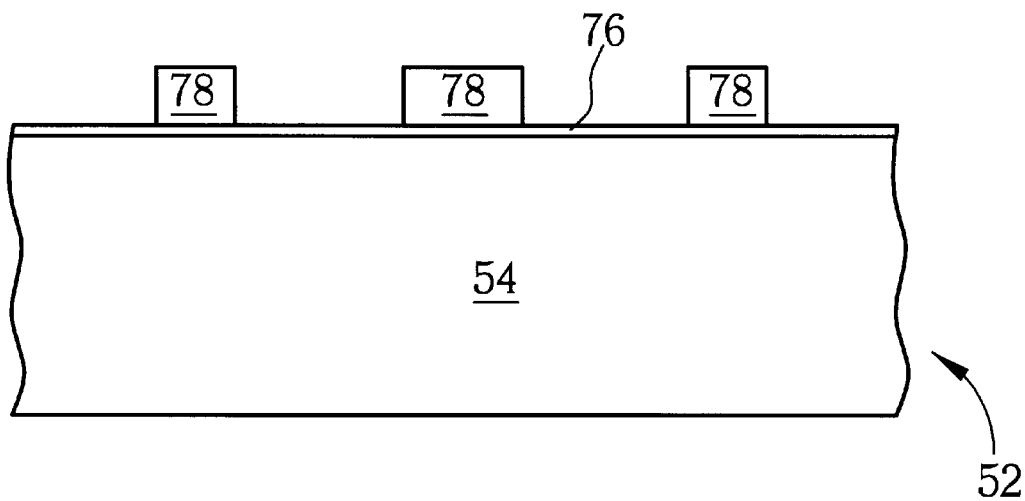
FIG. 4 to FIG. 7 are cross-sectional diagrams of the process of forming a first and second insulation layer and a doped area shown in FIG. 3.
Figure 5:
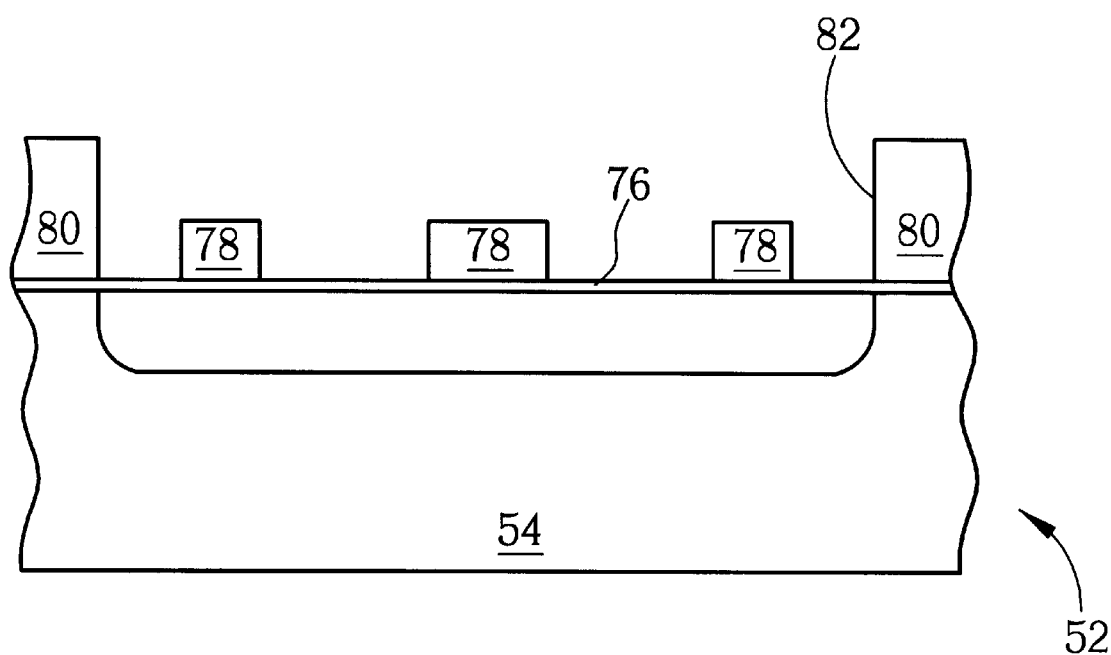

Please refer to FIG. 4 to FIG. 7. FIG. 4 to FIG. 7 are cross-sectional diagrams of the process of forming the first and second insulation layers 58, 70, and the doped area 60, shown in FIG. 3. As shown in FIG. 4, the method of forming the present invention HV MOS transistor 50 is first to form a pad oxide layer 76 on the substrate 54. Next, a silicon nitride ($Si_3N_4$) layer 78 is formed in three predetermined areas on the surface of the pad oxide layer 76 to separately define the positions of the source 64, gate 62 and drain 66 of the HV MOS transistor 50. As shown in FIG. 5, a lithographic process is performed to form a first photo-resist layer 80. The first photo-resist layer 80 has a hole 82 that is used to define the position of the doped area 60. An ion implantation process is then performed to implant dopants into the substrate 54 of the region of the hole 82. When forming the P-well of the N-type MOS transistor, boron (B) is the dopant used for the implantation process. However, when forming the N-well of the P-type MOS transistor, phosphorus (P) is used.

Figure 6:
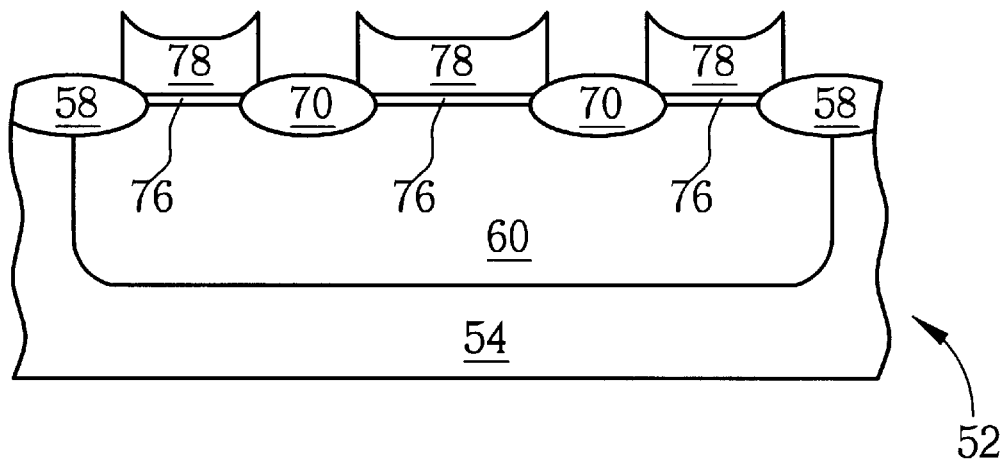
Figure 7:
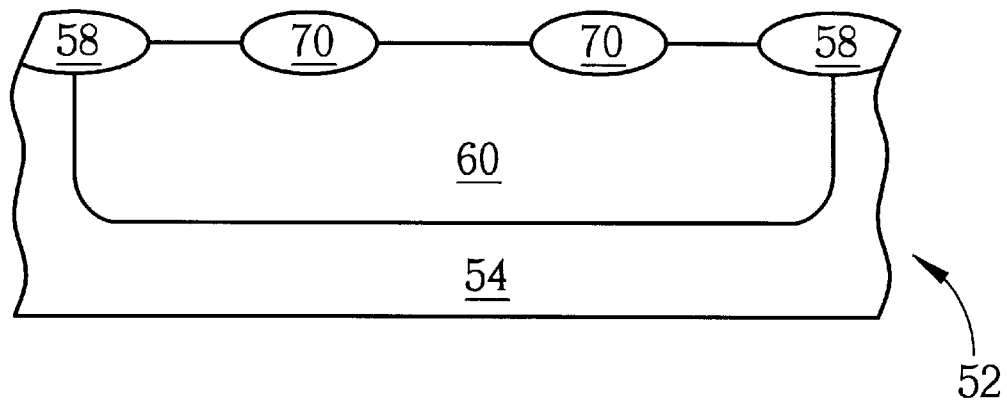

As shown in FIG. 6, after completing the ion implantation process, the first photo-resist layer 80 is completely removed and a high temperature thermal process is performed to drive the dopants (B or P) into the substrate 54 to form the doped area 60, serving as the P-well or the N-well. A thermal oxidation process is then performed to oxidize the silicon on the surface of the substrate that is not covered by the silicon nitride ($Si_3N_4$) layer 78 to form a field oxide layer made of silicon dioxide, which serves as the first and second insulation layers 58, 70. As shown in FIG. 7, an etching process is next performed to completely remove the silicon nitride ($Si_3N_4$) layer 78 and the pad oxide layer 76.

Figure 8:
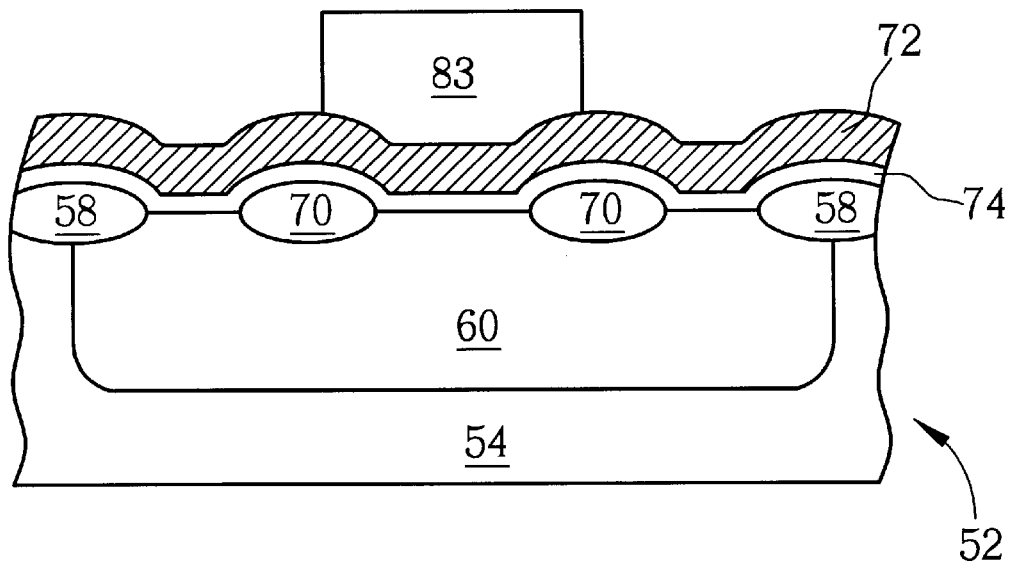
FIG. 8 to FIG. 10 are cross-sectional diagrams of the process of forming a gate, source and drain shown in FIG. 3.
Figure 9:
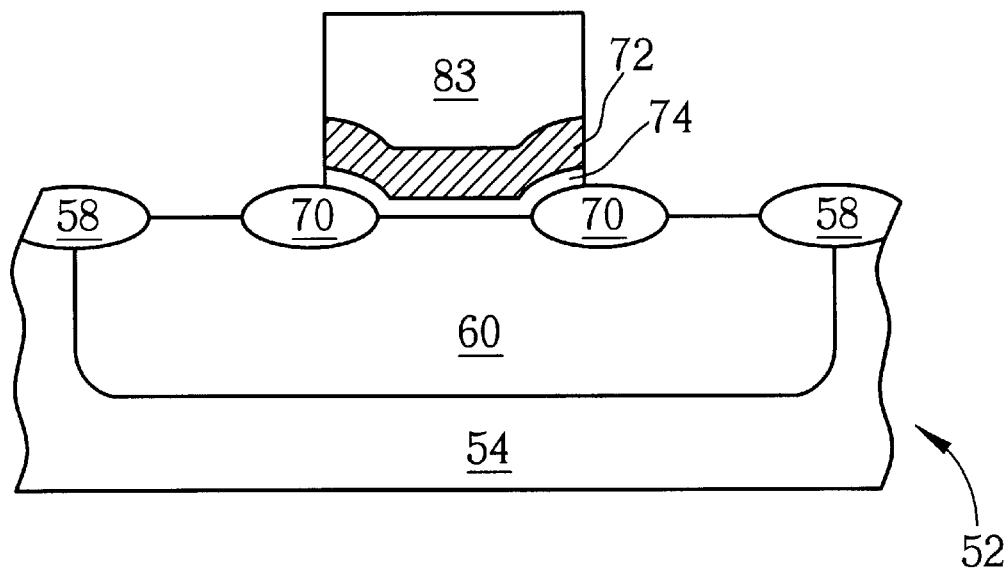
Figure 10:
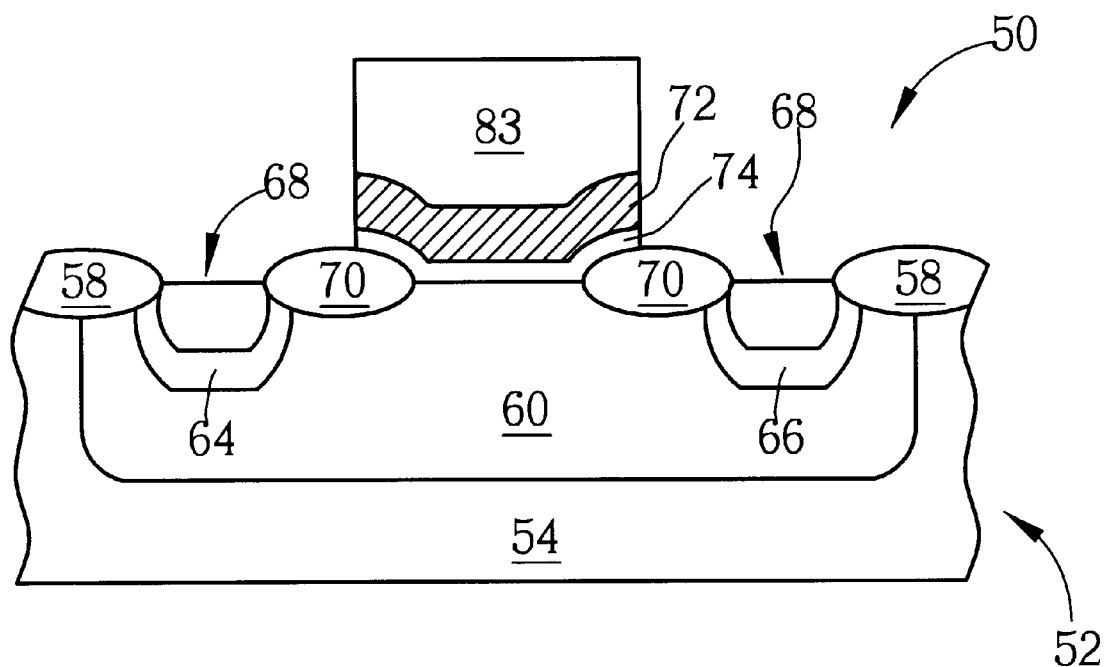

Please refer to FIG. 8 to FIG. 10. FIG. 8 to FIG. 10 are cross-sectional diagrams of the process of forming the gate 62, source 64 and drain 66 shown in FIG. 3. After the semiconductor wafer 52 shown in FIG. 7 is cleaned, a gate oxide layer 74 is formed on the surface of the semiconductor wafer 52. Then, a polysilicon layer 72 is formed on the gate oxide layer 74. The polysilicon 72 is doped with a high density of phosphorus (P) or arsenic (As) to form a doped polysilicon layer 72. A lithographic process is performed to form a second photo-resist layer 83 on the doped polysilicon layer 72 to define the position of the gate 62. As shown in FIG. 9, a dry etching process is performed to vertically remove the doped polysilicon layer 72 and the gate oxide layer 74 not covered by the photoresist layer 83.

As shown in FIG. 10, an ion implantation process is performed to implant phosphorus (P) ions and arsenic (As) ions into the surface of the substrate 54 that is not covered by either the first and second insulation layers 58, 70 or the second photo-resist layer 83, thereby forming the double diffuse drains (DDD) 68, which comprise the N-type doped areas as the source 64 and the drain 66 of the N-type HV MOS transistor. However, when forming the P-type HV MOS transistor, B and $BF_2+$ ions are implanted to form the double diffuse drains (DDD) 68, which comprise the P-type doped areas. Finally, the second photo-resist layer 83 is removed and an annealing process is performed to complete the present invention HV MOS transistor 50.

Figure 1:
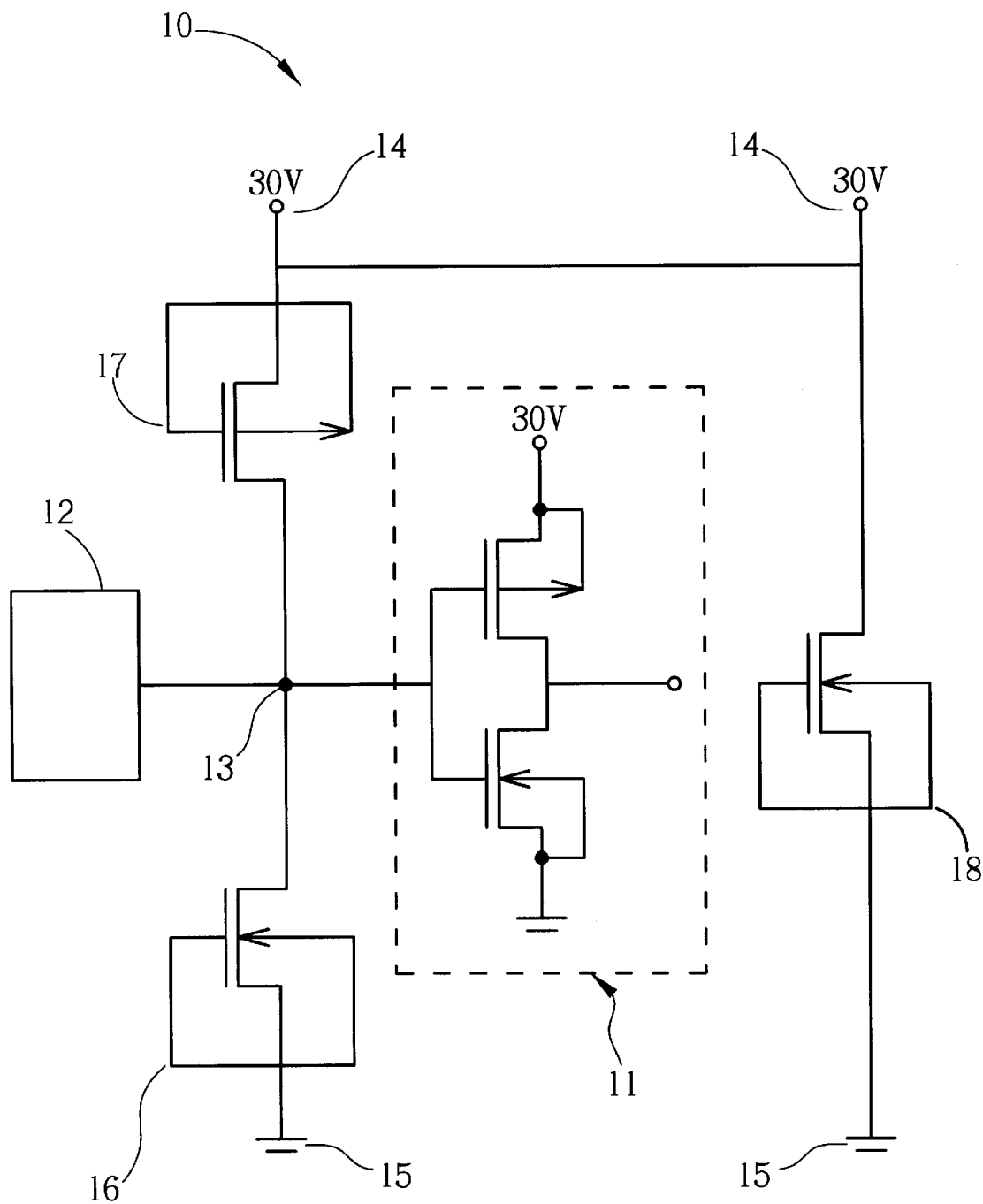
FIG. 1 is a circuit diagram of the prior art ESD protection circuit.
Figure 2:
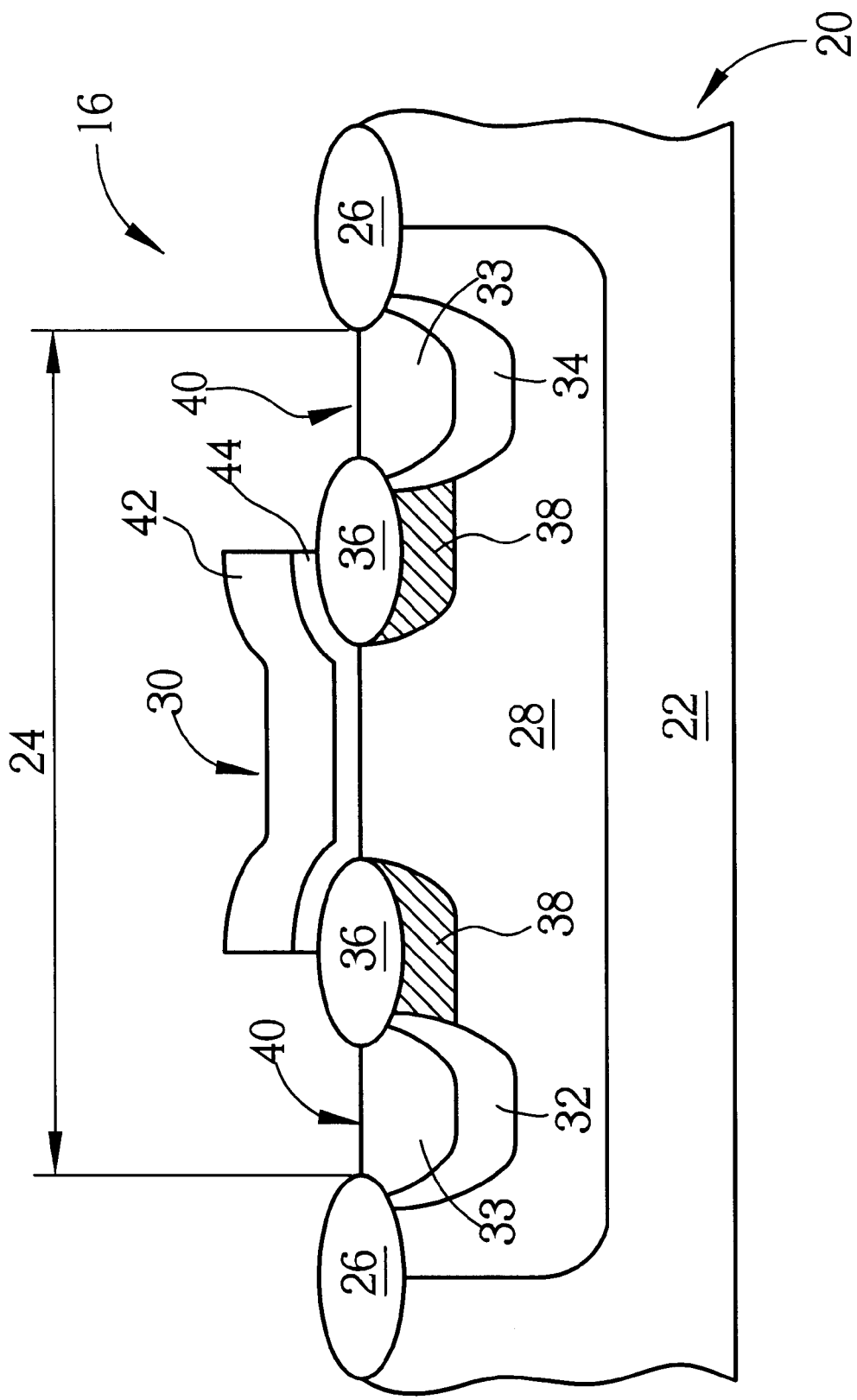
FIG. 2 is a cross-sectional diagram of the structure of the first N-type HV MOS transistor used in the ESD protection circuit shown in FIG. 1.

The present invention N-type and P-type HV MOS transistors are used as the first, second N-type and P-type HV MOS transistors 16, 18 and 17 in the protection circuit 10 shown in FIG. 1. The input port 13 of the ESD protection circuit 10 is electrically connected to the source 64 of the present invention HV MOS transistor 50, and the drain 66 and the gate 62 are electrically connected to the voltage source 14, or the grounding point 15. When an input voltage from the input port 13 is higher than a critical voltage between the source 64 and the drain 66, the source 64 and the drain 66 will electrically conduct together through the doped area 60 in the active region 56 so as to eliminate the input voltage from the input port 13.

The present invention HV MOS transistor gate 62 is made by stacking a doped polysilicon layer 72 on a gate oxide layer 74. There is no drift region at the intersection of the P-well 60 of the active region 56 and the second insulation layer 70, thus enhancing the critical voltage between the source 64 and the drain 66. In addition, because the present invention HV MOS transistor does not have a drift region, it avoids the high horizontal electric fields caused by tip effects, and so can avoid the short circuiting between the source 64 and the drain 66 that is caused by main carriers being emitted directly from the source 64 into the drain 66. When a high voltage is input into the present invention HV MOS transistor 50, the main carriers pass along the path from the source 64 to the doped area 60 of the active region 56 to the drain 66, thereby turning on the BJT transistor and causing it to discharge the high voltage to protect the internal circuits.

Compared to the prior art HV MOS transistor used in ESD protection circuits, the present invention HV MOS transistor used in ESD protection circuits has no drift region under the two opposite sides of the gate on the substrate. Hence, the extra processes required to form the drift region are not needed, and so the complexity of the total fabrication process is reduced. The intensity of the electric field of the path under the gate is also reduced. Short circuiting between the source and the drain caused by main carriers being directly emitted into the drain is also avoided. Consequently, when a high voltage is input into the present invention HV MOS transistor, the main carriers will pass along the path from the source to the doped area of the active region to the drain, turning on the BJT transistor and causing it to discharge the high voltage to protect the internal circuits.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A high voltage metal oxide semiconductor (HV MOS) transistor used in an electrostatic discharge (ESD) protection circuit, the ESD protection circuit formed on a semiconductor wafer and comprising an input port, the semiconductor wafer comprising a substrate, an active region formed in a predetermined area on the surface of the substrate, and a first insulation layer formed on the surface of the substrate and surrounding the active region, the active region comprising a doped area, the HV MOS comprising:

a gate installed on the active region;

a source and a drain installed inside the active region and positioned on opposite sides of the gate, both the source and the drain being double diffuse drains (DDD); and a second insulation layer installed on the active region and positioned between the gate and the source and between the gate and the drain, the second insulation layer used for insulating the gate from the source as well as insulating the gate from the drain wherein a drift region does not exist at the intersection of the doped area of the active region and the second insulation layer, thus enhancing the critical voltage between the source and the drain;

wherein the input port of the protection circuit is electrically connected to the source, and the drain and the gate are electrically connected to a voltage source; whereby when an input voltage from the input port is higher than a critical voltage between the source and the drain, the source and the drain will electrically conduct together through the doped area in the active region so as to eliminate the input voltage from the input port.

2. The HV MOS of claim 1 wherein the first insulation layer and the second insulation layer are made of silicon dioxide ($SiO_2$).

3. The HV MOS of claim 2 wherein the silicon dioxide is field oxide (FOX) made by thermal oxidation.

4. The HV MOS of claim 1 wherein the doped area of the active region is an N-well, and the source and the drain are P-type doped regions.

5. The HV MOS of claim 1 wherein the doped area of the active region is a P-well, and the source and the drain are N-type doped regions.

6. The HV MOS of claim 1 wherein the gate is made by stacking up a doped polysilicon layer and a gate oxide layer.

7. A high voltage metal oxide semiconductor (HV MOS) used in an electrostatic discharge (ESD) protection circuit, the ESD protection circuit formed on a semiconductor wafer, the semiconductor wafer comprising a substrate, an active region formed in a predetermined area on the surface of the substrate, and a first field oxide (FOX) layer surrounding the active region, the active region comprising a doped area, the HV MOS comprising:

a gate installed on the active region;

a source and a drain installed inside the active region and positioned on opposite sides of the gate, both the source and the drain being double diffuse drains (DDD); and a second field oxide layer installed on the active region and positioned between the gate and the source and between the gate and the drain, the second field oxide layer used for insulating the gate from the source as well as insulating the gate from the drain wherein a drift region does not exist at the intersection of the doped area of the active region and the second insulation layer, thus enhancing the critical voltage between the source and the drain;

wherein when an input voltage supplied to the protection circuit exceeds a predetermined voltage value, the input voltage will be transmitted to the source through the doped area of the active region so as to eliminate the input voltage.

8. The HV MOS of claim 7 wherein doped area of the active region is an N-well, and the source and the drain are P-type doped regions.

9. The HV MOS of claim 7 wherein the doped area of the active region is a , and the source and the drain are N-type doped regions.

10. The HV MOS of claim 7 wherein the gate is made by stacking up a doped polysilicon layer and a gate oxide layer.

* * * * *